(12) United States Patent
Yamazaki et al.

(10) Patent No.: US 11,362,488 B2
(45) Date of Patent: Jun. 14, 2022

(54) PANELBOARD DEVICE

(71) Applicant: FUJI ELECTRIC FA COMPONENTS & SYSTEMS CO., LTD., Saitama (JP)

(72) Inventors: Satoshi Yamazaki, Saitama (JP); Satoshi Machida, Gunma (JP); Kazuhiro Koizumi, Kanagawa (JP); Nobuya Suzuki, Tokyo (JP)

(73) Assignee: FUJI ELECTRIC FA COMPONENTS & SYSTEMS CO., LTD., Saitama (JP)

( * ) Notice: Subject to any disclaimer, the term of this patent is extended or adjusted under 35 U.S.C. 154(b) by 0 days.

(21) Appl. No.: 16/697,998

(22) Filed: Nov. 27, 2019

(65) Prior Publication Data

US 2020/0185893 A1 Jun. 11, 2020

(30) Foreign Application Priority Data

Dec. 5, 2018 (JP) .............................. JP2018-227815
Oct. 29, 2019 (JP) .............................. JP2019-196247

(51) Int. Cl.
H02B 1/32 (2006.01)
H05K 5/02 (2006.01)
H02B 1/38 (2006.01)

(52) U.S. Cl.
CPC ................. H02B 1/32 (2013.01); H02B 1/38 (2013.01); H05K 5/0217 (2013.01)

(58) Field of Classification Search
None
See application file for complete search history.

(56) References Cited

U.S. PATENT DOCUMENTS

| 7,719,436 | B2 * | 5/2010 | Feight ................ H04B 10/1141 340/815.45 |
| 2009/0040065 | A1 * | 2/2009 | Dalton .................... H05B 45/56 340/815.45 |
| 2016/0006223 | A1 * | 1/2016 | Sinistro ..................... H02B 7/06 361/622 |
| 2016/0123600 | A1 * | 5/2016 | Phillips ............... H04L 12/2825 99/337 |

(Continued)

FOREIGN PATENT DOCUMENTS

| JP | 2004-348411 | 12/2004 |
| WO | 2008/042052 | 4/2008 |

(Continued)

OTHER PUBLICATIONS

Preliminary Search Report dated Nov. 18, 2021 issued with respect to the corresponding French Patent Application No. FR1913417.

*Primary Examiner* — Mukundbhai G Patel
(74) *Attorney, Agent, or Firm* — IPUSA, PLLC

(57) ABSTRACT

A panelboard device according to an embodiment includes a housing and multiple devices stored in the housing. At least one of the multiple devices includes a device main unit; a state detecting unit configured to detect a state of the device main unit; a light emitting unit; and a light emission control unit configured to acquire information indicating the state of the device main unit from the state detecting unit, and to cause the light emitting unit to transmit an optical signal including information indicating the state.

10 Claims, 12 Drawing Sheets

(56) References Cited

U.S. PATENT DOCUMENTS

| | | | |
|---|---|---|---|
| 2016/0225562 A1* | 8/2016 | Franks | H02H 3/08 |
| 2017/0138999 A1* | 5/2017 | Kim | G01R 31/1272 |
| 2018/0248347 A1* | 8/2018 | Pappas | H02G 3/081 |
| 2019/0170804 A1* | 6/2019 | Thomas | H01H 47/18 |

FOREIGN PATENT DOCUMENTS

| | | |
|---|---|---|
| WO | 2015/061001 | 4/2015 |
| WO | 2017/174994 | 10/2017 |

\* cited by examiner

POWER ON: NORMAL
LIGHT EMITTING UNIT 23: BLINK

POWER OFF
LIGHT EMITTING UNIT 23: BLINK
(FIRST PATTERN)

POWER ON: ERROR
LIGHT EMITTING UNIT 23: BLINK
(SECOND PATTERN)

FIG.11

| DEVICE ID | TYPE | POWER STATE | OPERATING STATE | VOLTAGE | CURRENT | CAUSE OF ERROR |
|---|---|---|---|---|---|---|
| D01 | CIRCUIT BREAKER | ON | NORMAL | 5 | 10 | – |
| D02 | INVERTER | ON | NORMAL | 2 | 10 | – |
| D03 | INVERTER | OFF | – | – | – | – |
| D04 | ELECTROMAGNETIC SWITCH | ON | ERROR | 0 | 0 | DISCONNECTION |
| ... | ... | ... | ... | ... | ... | ... |

PANELBOARD DEVICE

CROSS-REFERENCE TO RELATED APPLICATION

This patent application is based on and claims priority to Japanese Patent Application No. 2018-227815 filed on Dec. 5, 2018, and Japanese Patent Application No. 2019-196247 filed on Oct. 29, 2019, the entire contents of which are incorporated herein by reference.

BACKGROUND OF THE INVENTION

1. Field of the Invention

The present invention relates to a panelboard device.

2. Description of the Related Art

Generally, a panelboard device, such as a power receiving panel, is monitored by a centralized monitoring system. When an error occurs in the panelboard device, an error is detected by the centralized monitoring system and a maintenance technician is dispatched to the site. Traditionally, a maintenance technician dispatched to the site manually identified a location, in which an error has occurred, and a cause of the error, by referring to a drawings or a manual, to repair the panelboard device. For this reason, it took a long time to repair the panelboard device.

As a method of solving such a problem, a method of transmitting a status of each device installed in a panelboard device to a terminal owned by a maintenance technician, by a communication device installed in the panelboard device via an external server, has been proposed. By this method, the maintenance technician can easily grasp identification information and a status of each device transmitted from the communication device.

According to the above-described method, the identification information of the device to be transmitted by the communication device is assigned to the device ex post facto. In other words, the identification information is not recorded in the device itself. For this reason, because a maintenance technician cannot understand at once which device corresponds to the identification information transmitted from the communication device, the maintenance technician needs to identify the corresponding device on-site based on information such as device type information transmitted along with the identification information. As this identification operation requires a long time, it is difficult to shorten the repair time of the panelboard device in the above-described method. In addition, because the above-described method requires installation of a communication device on the panelboard device and an external server for collecting information from the panelboard device, it incurs a significant cost.

The present invention has been made in view of the above-described problems, and aims at providing a panelboard device capable of quick repair.

RELATED-ART DOCUMENTS

Patent Document

[Patent Document 1] Japanese Laid-open Patent Application Publication No. 2004-348411

SUMMARY OF THE INVENTION

A panelboard device according to an embodiment includes a housing and multiple devices stored in the housing. At least one of the multiple devices includes a device main unit; a state detecting unit configured to detect a state of the device main unit; a light emitting unit; and a light emission control unit configured to acquire information indicating the state of the device main unit from the state detecting unit, and to cause the light emitting unit to transmit an optical signal including information indicating the state.

BRIEF DESCRIPTION OF THE DRAWINGS

FIG. 11 is a diagram illustrating an example of information indicating a state of the device main unit displayed on a display device of a terminal.

DETAILED DESCRIPTION OF THE PREFERRED EMBODIMENTS

Figure 1:
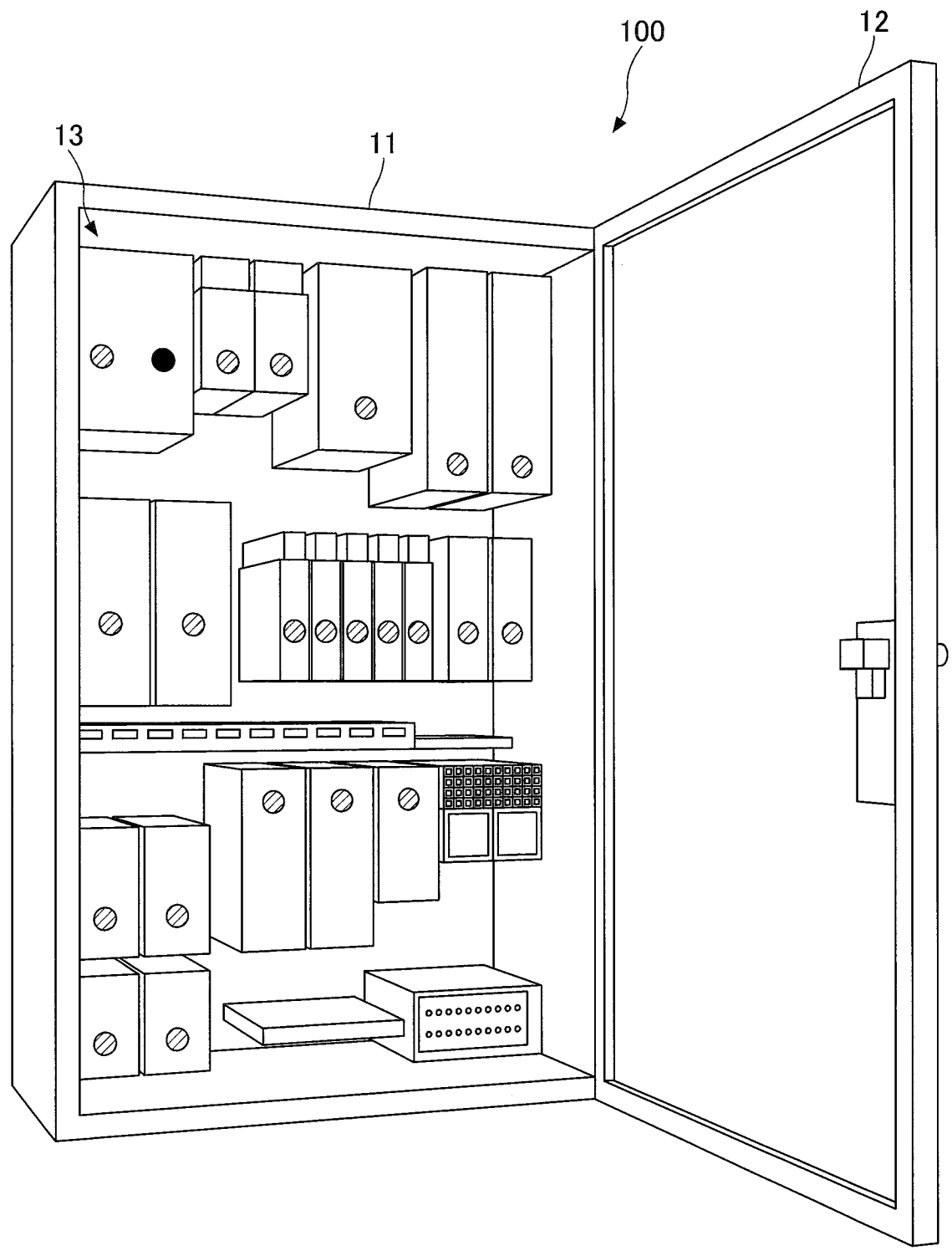
FIG. 1 is a perspective view illustrating an example of a panelboard device when a door is opened.

Hereinafter, each embodiment of the present invention will be described with reference to the accompanying drawings. With regard to the description and drawings in accordance with each embodiment, for components having substantially the same functional configuration, an overlapping description is omitted by giving the same reference numerals.

The panelboard device 100 according to an embodiment will be described with reference to FIGS. 1 to 12. The panelboard device 100 according to this embodiment may be any device including a housing and multiple devices housed in the housing. The panelboard device 100 may be, for example, a control panel, a switchboard, a distribution panel, or a power receiving panel, but is not limited thereto.

Figure 2:
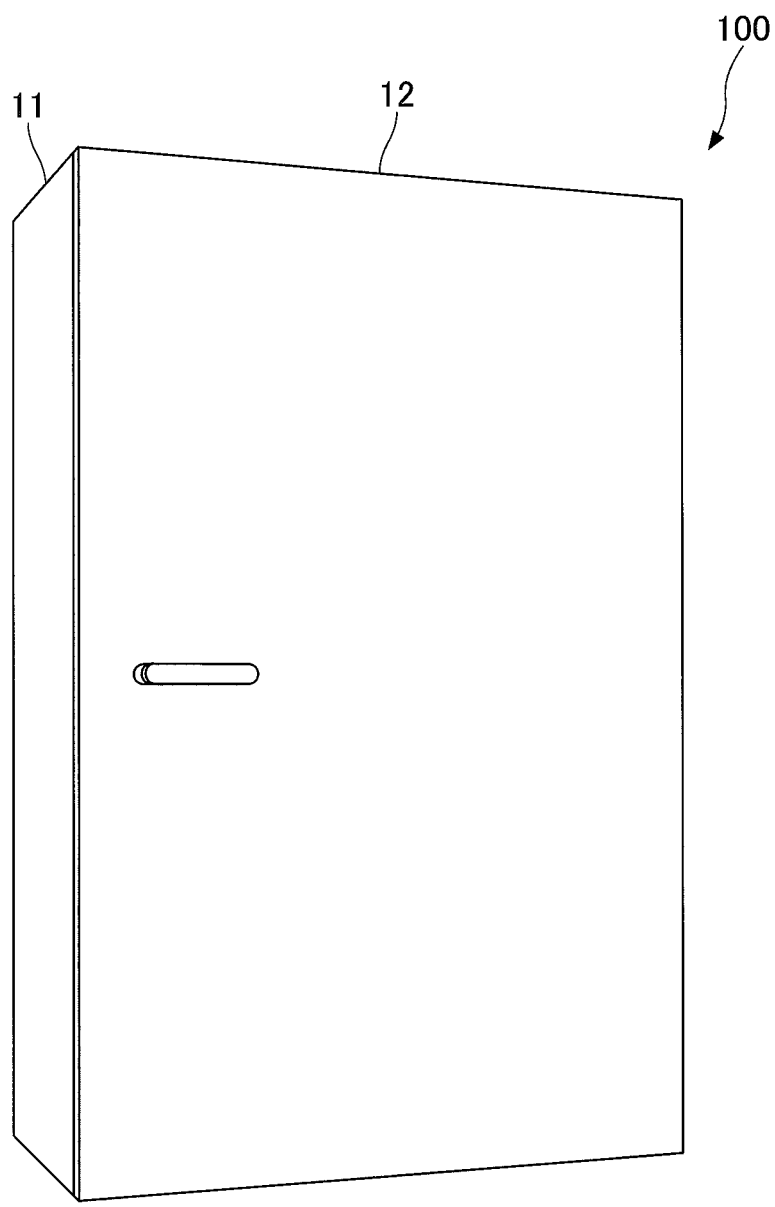
FIG. 2 is a perspective view illustrating an example of the panelboard device when the door is closed.
Figure 3:
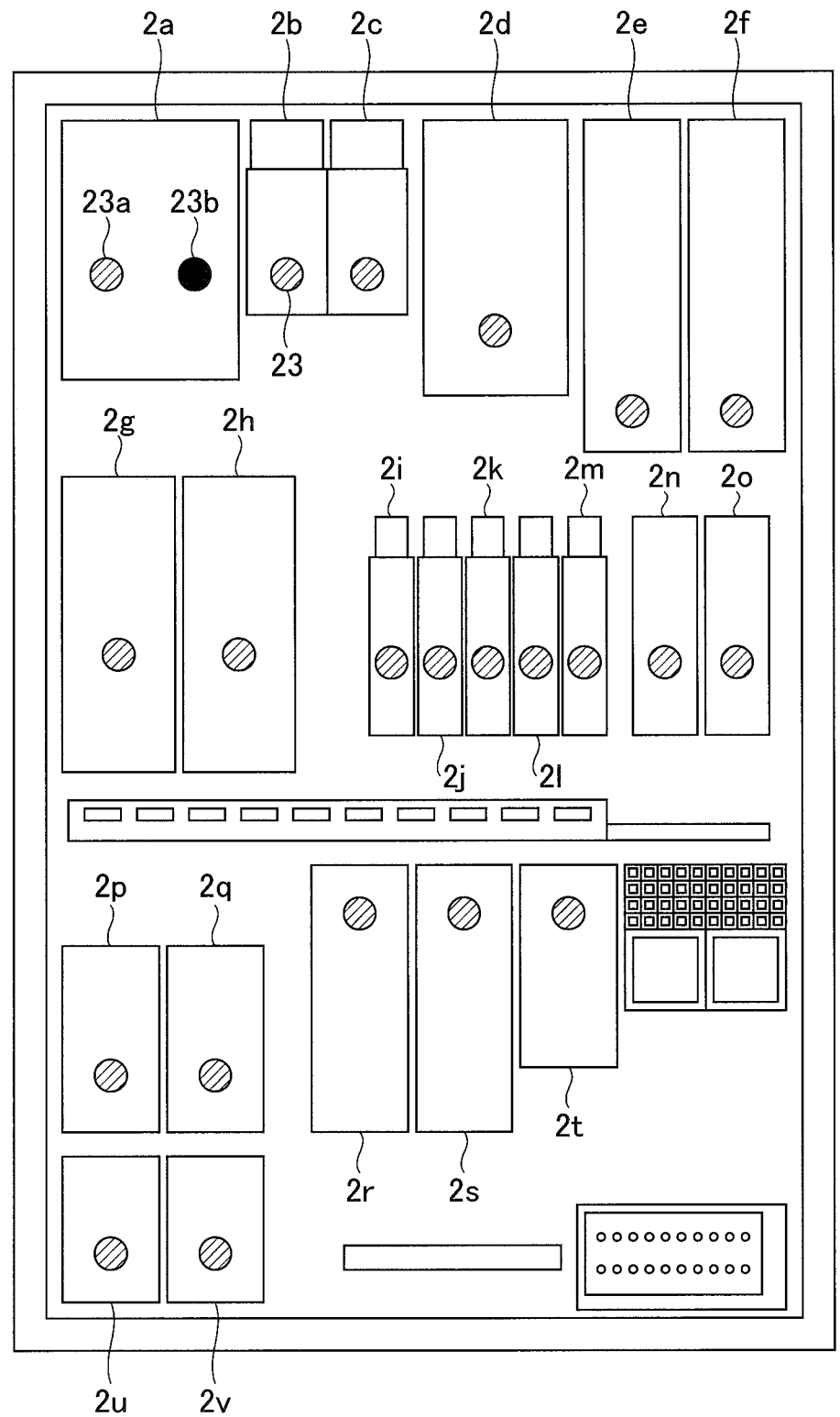
FIG. 3 is an example of a front view of the panelboard device.

FIG. 1 is a perspective view illustrating an example of the panelboard device 100 when a door is opened. FIG. 2 is a perspective view illustrating an example of the panelboard device 100 when the door is closed. FIG. 3 is a front view illustrating an example of the panelboard device 100. In FIG. 3, illustration of the door 12 is omitted. As illustrated in FIGS. 1 to 3, the panelboard device 100 includes a storage section 11, a door 12, and multiple devices 2a to 2v. A set of the storage section 11 and the door 12 may be referred to as a housing. Hereinafter, when the devices 2a to 2v are not distinguished, each of the devices 2a to 2v is referred to as a device 2.

The housing houses the multiple devices 2 inside. The housing of FIG. 1 has a rectangular parallelepiped shape and is formed of metal, but the shape and material of the housing are not limited thereto. The storage section 11 forms a back surface (a surface at the back in FIG. 2) and side surfaces (surfaces perpendicular to a bottom) of the housing, and has an opening 13 on one side. The door 12 forms a front surface of the housing (a surface at the front side in FIG. 2), and is attached to the storage section 11 so as to open and close the opening 13 of the storage section 11. The door 12 of FIG. 1 is a hinged door, but may be a sliding door.

The housing is secured to a wall of a building or the like on its back. When a failure of the panelboard device 100 is detected by a centralized monitoring system, a maintenance technician dispatched to the site (where the panelboard device 100 is installed) opens the door 12, and repairs the device 2 stored inside the housing.

The device 2 is any device constituting the panelboard device 100, and is housed inside the housing, with the device 2 fixed to the back surface or the side surface of the storage section 11. An example of the device 2 may include, but is not limited to, a circuit breaker, an electromagnetic switch, an inverter, a servo controller, an amplifier, a relay, a thermal relay, or a timer. Types and the number of the devices 2 stored in the panelboard device 100 are appropriately selected according to a type and application of the panelboard device 100.

Figure 4:
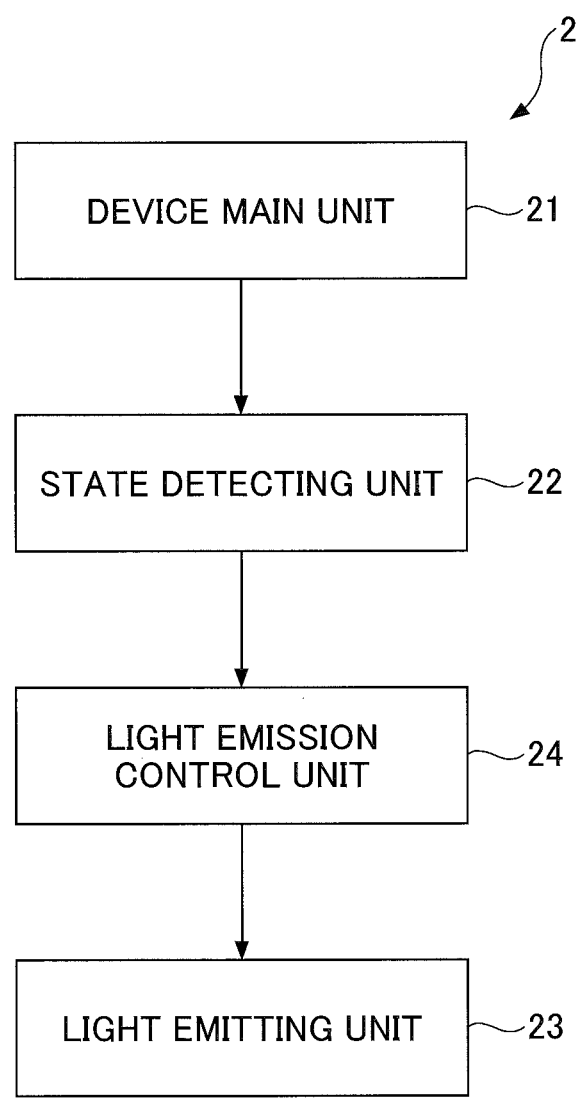
FIG. 4 is a diagram illustrating an example of a hardware configuration of a device.

FIG. 4 is a diagram illustrating an example of a hardware configuration of the device 2. The device 2, as illustrated in FIG. 4, includes a device main unit 21, a state detecting unit 22, a light emitting unit 23, and a light emission control unit 24.

The device main unit 21 is hardware that implements a main function of the device 2. A configuration of the device main unit 21 is appropriately designed according to a type of the device 2. For example, when the device 2 is an electromagnetic switch, the device main unit 21 includes a coil that functions as an electromagnet, a spring that energizes the coil, a power supply circuit that supplies power to the coil, a contact that disconnects or connects a circuit according to a position of the coil, and a control circuit such as a microcontroller that controls an overall operation.

The state detecting unit 22 is hardware for detecting a state of the device main unit 21. The state detecting unit 22 can be any circuit or sensor that detects a power state (ON/OFF state of a power supply), an operating state (presence or absence of an error), a current value, a voltage value, or an operating frequency. The state detecting unit 22 may detect the state of the device main unit 21 by hardware or may detect the state of the device main unit 21 by software. The device 2 in FIG. 4 includes the single state detecting unit 22, but may include multiple state detecting units 22.

The light emitting unit 23 is an element that can emit light, and emission is controlled by the light emission control unit 24. As will be described later, the light emitting unit 23 transmits an optical signal by blinking. The optical signal is a communication signal of optical communication. The optical signal will be described below. The light emitting unit 23 is, for example, an LED (Light Emitting Diode), but is not limited thereto. Light emitted by the light emitting unit 23 may be light usable in optical communication, such as visible light or invisible light such as infrared light, but is not limited thereto. The multiple light emitting units 23 in the panelboard device 100 may each emit light having the same wavelength, or may emit light each having a different wavelength. The device 2 may include one light emitting unit 23, or may include two or more light emitting units 23. For example, in the example of FIG. 3, a device 2b includes a single light emitting unit 23, and a device 2a includes two light emitting units 23a and 23b. The panelboard device 100 may include a device 2 that includes the light emitting unit 23 and a device 2 that does not include the light emitting unit 23. In either case, as illustrated in FIG. 1, the light emitting unit 23 is disposed on the device 2 so as to be exposed from the opening 13 when the door 12 of the housing is opened. In other words, the light emitting unit 23 is disposed at the device 2 so that a maintenance technician can see the light emitting unit 23 when the door 12 of the housing is opened.

The light emission control unit 24 is a control circuit such as a microcontroller, and includes a CPU (Central Processing Unit), a ROM (Read Only Memory), and a RAM (Random Access Memory). Functions of the light emission control unit 24 are realized by the CPU loading a program, stored in the ROM, into the RAM, and executing the program loaded into the RAM.

The light emission control unit 24 is connected to the state detecting unit 22, and acquires information indicating a state of the device main unit 21 from the state detecting unit 22. The acquired information is saved in the RAM. The light emission control unit 24 is also connected to the light emitting unit 23, and performs light emission control of the light emitting unit 23. Specifically, the light emission control unit 24 causes the light emitting unit 23 to transmit an optical signal that contains the information indicating the state of the device main unit 21 acquired from the state detecting unit 22, by causing the light emitting unit 23 to blink at a predetermined frequency. The optical signal includes information indicating at least one of a power state, an operating state, a current value, a voltage value, and an operating frequency of the device main unit 21 detected by the state detecting unit 22.

When an error occurs in the device main unit 21 (that is, when information indicating that an error has occurred in the device main unit 21 is acquired from the state detecting unit 22), the light emission control unit 24 may specify a cause of the error based on the information acquired from the state detecting unit 22. The light emission control unit 24 can specify the cause of the error by referring to a table (error cause table) indicating a relationship between information indicating a state of the device main unit 21 and a cause of an error. The error cause table is prepared in advance, and is stored in the ROM of the light emission control unit 24.

When the light emission control unit 24 specifies a cause of an error that has occurred in the device main unit 21, the optical signal may include information indicating the cause of the error of the device main unit 21 specified by the light emission control unit 24.

The optical signal may also include information indicating identification information, a type, a model number, and the like of the device main unit 21.

Each of the multiple light emission control units 24 installed in the panelboard device 100 may cause the corresponding light emitting unit 23 to transmit an optical signal having the same frequency. In this case, the multiple light emitting units 23 in the panelboard device 100 transmit optical signals each having the same frequency.

Each of the light emission control units 24 installed in the panelboard device 100 may cause the corresponding light emitting unit 23 to transmit an optical signal of a frequency in accordance with a type of the device 2 in which the corresponding light emitting unit 23 is installed. In this case, the light emitting unit 23 installed in a circuit breaker transmits an optical signal having a frequency defined for a circuit breaker, and the light emitting unit 23 installed in an electromagnetic switch transmits an optical signal having a frequency defined for an electromagnetic switch. By making frequencies of optical signals different as described above, reading of the optical signals is facilitated.

It is preferable that light emitted by the light emitting unit 23 is visible light. If light emitted by the light emitting unit 23 is visible light, because the light can be seen by a maintenance technician, a state of the device main unit 21 can be simply presented to the maintenance technician by the light emitting unit 23.

In a case in which the light emitting unit 23 emits visible light and in which a frequency of an optical signal transmitted with the visible light is sufficiently high, the optical signal is a communication signal for visible light communication. The light emitting unit 23 (i.e., the light emitting unit 23 that blinks at a predetermined frequency which is sufficiently high) that transmits a visible light signal (optical signal utilizing visible light) appears to be constantly on to a person.

Here, a case in which the device 2 includes one light emitting unit 23 that emits visible light will be considered. In a case in which the device 2 includes one light emitting unit 23 that emits visible light, by changing a state of the light emitting unit 23 in accordance with a power state of the device main unit 21, the light emitting unit 23 can indicate the power state of the device main unit 21. For example, the light emitting unit 23 may continuously blink (transmit an optical signal) while the power of the device main unit 21 is ON, and the light emitting unit 23 may repeatedly turn off and blink in a predetermined pattern while the power of the device main unit 21 is OFF.

Thus, by seeing a state of the light emitting unit 23, a maintenance technician can easily grasp a power state of the device main unit 21 equipped with the light emitting unit 23. In addition, because the light emitting unit 23 blinks continuously or intermittently regardless of the power state of the device main unit 21, the light emitting unit 23 can transmit an optical signal regardless of the power state of the device main unit 21. That is, the light emitting unit 23 can achieve both a simplified display of the power state of the device main unit 21 and a transmission of an optical signal having information indicating the power state of the device main unit 21, regardless of the power state of the device main unit 21.

In a case in which the device 2 includes one light emitting unit 23 that emits visible light, by changing a state of the light emitting unit 23 in accordance with an operating state of the device main unit 21, the light emitting unit 23 can indicate the operating state of the device main unit 21. For example, the light emitting unit 23 may repeatedly blink while the device main unit 21 is normal, and the light emitting unit 23 may repeatedly turn off and blink in a predetermined pattern while the device main unit 21 is in an error state.

Thus, by seeing a state of the light emitting unit 23, a maintenance technician can easily grasp an operating state of the device main unit 21 equipped with the light emitting unit 23. In addition, because the light emitting unit 23 blinks continuously or intermittently regardless of the operating state of the device main unit 21, the light emitting unit 23 can transmit an optical signal regardless of the operating state of the device main unit 21. That is, the light emitting unit 23 can achieve both a simplified display of the operating state of the device main unit 21 and a transmission of an optical signal having information indicating the operating state of the device main unit 21, regardless of the operating state of the device main unit 21.

Figure 5A:
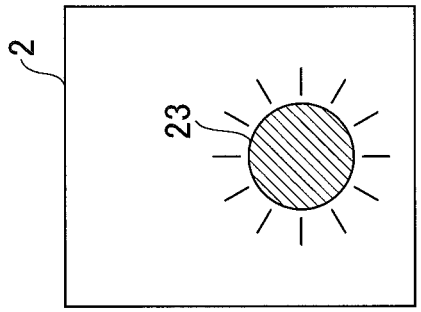
FIGS. 5A to 5C are diagrams schematically illustrating a method of a simplified display of a power state and an operating state of a device main unit by utilizing a single light emitting unit.
Figure 5B:
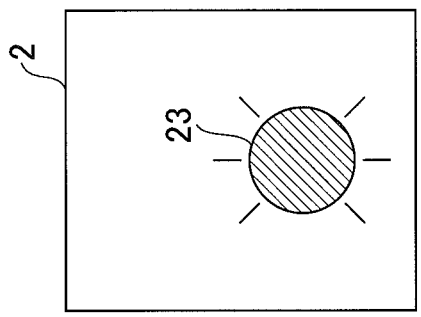
Figure 5C:
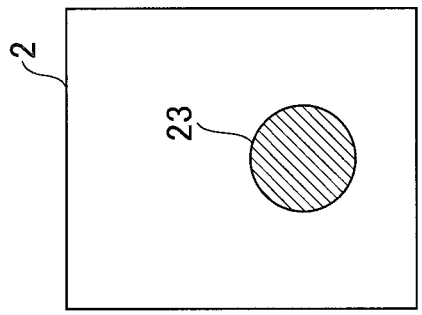

Further, in a case in which the device 2 includes one light emitting unit 23 that emits visible light, the light emitting unit 23 can indicate a power state and an operating state of the device main unit 21. FIGS. 5A to 5C are diagrams schematically illustrating a method for simplified display of the power state and the operating state of the device main unit 21 by using one light emitting unit 23. In the example of FIGS. 5A to 5C, the light emitting unit 23 repeatedly turns off and blinks in a predetermined first pattern while the power of the device main unit 21 is OFF (FIG. 5B); the light emitting unit 23 continuously blinks while the power of the device main unit 21 is ON and the device main unit 21 is normal (FIG. 5A); and the light emitting unit 23 repeatedly turns off and blinks in a predetermined second pattern different from the first pattern while the power of the device main unit 21 is ON and an error occurs in the device main unit 21 (FIG. 5C).

Thus, by seeing a state of the light emitting unit 23, a maintenance technician can easily ascertain a power state and an operating state of the device main unit 21 equipped with the light emitting unit 23. In addition, because the light emitting unit 23 blinks continuously or intermittently regardless of the power state and the operating state of the device main unit 21, the light emitting unit 23 can transmit an optical signal regardless of the power state and the operating state of the device main unit 21. That is, the light emitting unit 23 can achieve both a simplified display of the power state and the operating state of the device main unit 21, and a transmission of an optical signal having information indicating the power state and the operating state of the device main unit 21, regardless of the power state and the operating state of the device main unit 21. A method of a simplified display of a state of the device main unit 21 by using a single light emitting unit 23 is not limited to the above-described example.

Figure 6:
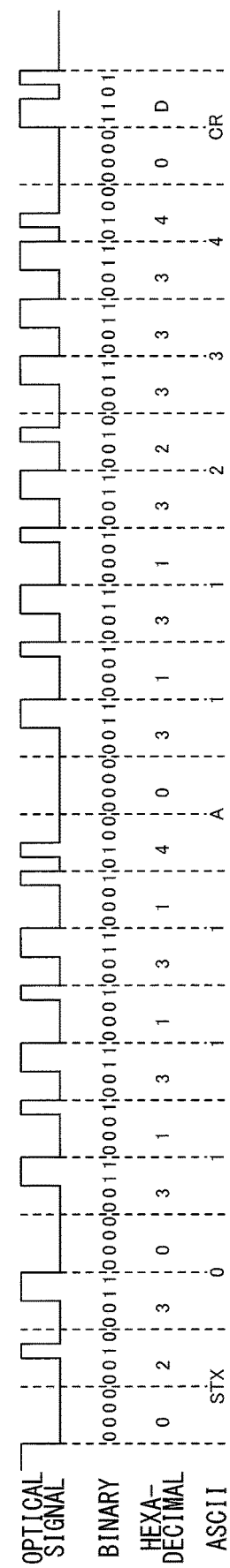
FIG. 6 is a diagram illustrating an example of an optical signal.

Next, an example of an optical signal will be described. FIG. 6 is a diagram illustrating an example of an optical signal. The optical signal of FIG. 6 has a start bit signal of 8 bits, a device type bit signal of 16 bits, a state bit signal of 16 bits, a measurement type bit signal of 16 bits, a measurement value bit signal of 32 bits, and an end bit signal of 8 bits.

The start bit signal indicates start of an optical signal. The device type bit signal indicates a type of the device main unit 21. The state bit signal indicates a power state and an operating state of the device main unit 21. The measurement type bit signal indicates a type of a measurement target in the device main unit 21. The measured value bit signal represents a measured value in the device main unit 21. The end bit signal indicates end of the optical signal.

In this example, the start bit is represented by STX (0x02). With respect to the device type bit signal, 01 represents a circuit breaker, 02 represents an electromagnetic switch, and 03 represents an inverter. With respect to the state bit signal, 01 represents "ON" (power ON), 02 represents "OFF" (power OFF), 11 represents "ON and error", and 12 represents "OFF and error". With respect to the measurement type bit signal, A1, A2, A3, and A4 represent current channels 1, 2, 3, and 4, respectively. The end bit signal is represented by CR (0x0d). Note that the values of the device type bit signal, the state bit signal, and the measurement type bit signal are all ASCII character strings.

When a status of a circuit breaker (the device main unit 21) is "ON and error", the current channel 1 of the circuit breaker is to be measured, and a current value of the current channel 1 is 1234 (in an ASCII string), the light emitting unit 23 installed in the breaker transmits information "(STX) 0111A11234(CR)" as an optical signal, as illustrated in FIG. 6. This information is represented in hexadecimal by "02303131314031313233340D". Because an optical signal is a binary signal, the light emitting unit 23 transmits an optical signal representing this information as a binary number. Specifically, the light emitting unit 23 transmits an optical signal having information "(STX)0111A11234(CR)" by blinking according to a timing chart illustrated in FIG. 6. Incidentally, in the example of FIG. 6, it is assumed that a turn-on state of the light emitting unit 23 represents 1 (high) and a turn-off state of the light emitting unit 23 represents 0 (low). However, this relationship between states of the light emitting unit 23 and a value of a bit may be inverse.

Further, when an optical signal as illustrated in FIG. 6 is transmitted to a terminal device that receives the optical signal, in order that the terminal device can operate in synchronization with the optical signal, the light emission control units 24 adds a synchronization signal to the head of the optical signal, and causes the light emitting unit 23 to transmit, to the terminal device, the optical signal to which the synchronization signal is added. An example of the synchronization signal is a bit pattern in which "1" and "0" appear alternately, such as "10101010". In the following description, the synchronization signal may also be referred to as a synchronization bit pattern.

Next, consider a case in which the device 2 includes two light emitting units 23a and 23b that emit visible light. In a case in which the device 2 includes two light emitting units 23a and 23b that emit visible light, a power state of the device main unit 21 can be indicated by using states of the light emitting units 23a and 23b. For example, while power of the device main unit 21 is ON, the light emitting unit 23a may blink continuously, and the light emitting unit 23b may be turned off. Also, while the power of the device main unit 21 is OFF, the light emitting unit 23a may be turned off and the light emitting unit 23b may blink continuously.

Thus, from states of the light emitting units 23a and 23b, a maintenance technician can easily ascertain a power state of the device main unit 21 equipped with the light emitting units 23a and 23b. In addition, because the light emitting unit 23a or the light emitting unit 23b continuously blinks regardless of the power state of the device main unit 21, an optical signal can be transmitted by the light emitting unit 23a or the light emitting unit 23b regardless of the power state of the device main unit 21. That is, the light emitting unit 23a and the light emitting unit 23b can achieve both a simplified display of the power state of the device main unit 21 and a transmission of an optical signal having information indicating the power state of the device main unit 21, regardless of the power state of the device main unit 21.

In addition, in a case in which the device 2 includes two light emitting units 23a and 23b that emit visible light, an operating state of the device main unit 21 can be indicated by utilizing states of the light emitting units 23a and 23b. For example, while the device main unit 21 is normal, the light emitting unit 23a may blink continuously and the light emitting unit 23b may be turned off. While the device main unit 21 is in an error state, the light emitting unit 23a may be turned off and the light emitting unit 23b may blink continuously.

Thus, from states of the light emitting units 23a and 23b, a maintenance technician can easily ascertain an operating state of the device main unit 21 equipped with the light emitting units 23a and 23b. Because the light emitting unit 23a or the light emitting unit 23b blinks continuously regardless of the operating state of the device main unit 21, an optical signal can be transmitted by the light emitting unit 23a or the light emitting unit 23b regardless of the operating state of the device main unit 21. That is, the light emitting unit 23a and the light emitting unit 23b can achieve both a simplified display of the operating state of the device main unit 21 and a transmission of an optical signal having information indicating the operating state of the device main unit 21 regardless of the operating state of the device main unit 21.

Figure 7A:
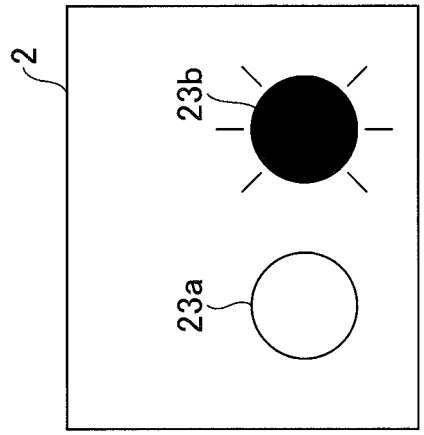
FIGS. 7A to 7C are diagrams schematically illustrating a method of simplified display of a power state and an operating state of the device main unit by utilizing two light emitting units.
Figure 7B:
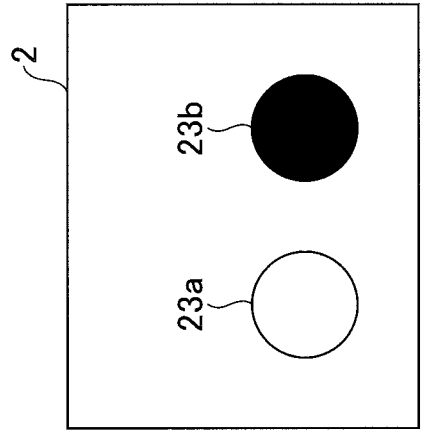
Figure 7C:
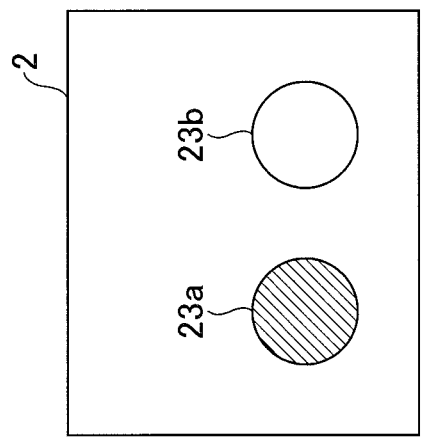

Further, in a case in which the device 2 includes two light emitting units 23a and 23b that emit visible light, a power state and an operating state of the device main unit 21 can be indicated by utilizing states of the light emitting units 23a and 23b. FIGS. 7A to 7C are diagrams schematically illustrating a method for simplified display of the power state and the operating state of the device main unit 21 by two light emitting units 23a and 23b. In the example illustrated in FIGS. 7A to 7C, while the power of the device main unit 21 is OFF, the light emitting unit 23a is turned off and the light emitting unit 23b blinks continuously (FIG. 7B); while the power of the device main unit 21 is ON and the device main unit 21 is normal, the light emitting unit 23a blinks continuously and the light emitting unit 23b is turned off (FIG. 7A); and while the power of the device main unit 21 is ON and an error occurs in the device main unit 21, the light emitting unit 23a turns off and the light emitting unit 23b repeatedly turns off and blinks in a predetermined pattern (FIG. 7C).

Thus, from the state of the light emitting units 23a and 23b, a maintenance technician can easily ascertain a power state and an operating state of the device main unit 21 equipped with the light emitting units 23a and 23b. In addition, because the light emitting unit 23a or the light emitting unit 23b blinks continuously or intermittently regardless of the power state and the operating state of the device main unit 21, an optical signal can be transmitted by the light emitting unit 23a or the light emitting unit 23b regardless of the power state and the operating state of the device main unit 21. That is, the light emitting unit 23a and the light emitting unit 23b can achieve both a simplified display of the power state and the operating state of the device main unit 21, and a transmission of an optical signal having information indicating the power state and the operating state of the device main unit 21, regardless of the power state and the operating state of the device main unit 21.

It should be noted that a method of a simplified display of a state of the device main unit 21 by using the two light emitting units 23a and 23b is not limited to the above-described example. Also, in a case in which the device 2 includes two light emitting units 23a and 23b each of which emits visible light, it is preferable that the light emitting units 23a and 23b emit light each having different wavelength. Specifically, it is preferable that the light emitting unit 23a (first light emitting unit) emits light of a first color, and the light emitting unit 23b (second light emitting unit) emits light of a second color different from the first color. In the example of FIG. 7, it is assumed that the light emitting unit 23a emits light in the first color (green, for example) and the light emitting unit 23b emits light in the second color (red, for example), but the first color and the second color are not limited thereto. If the color of each light emitted by the light emitting units 23a and 23b is different as described above, a maintenance technician can more easily ascertain a state of the device main unit 21 equipped with the light emitting units 23a and 23b, from the state of the light emitting units 23a and 23b.

Figure 8:
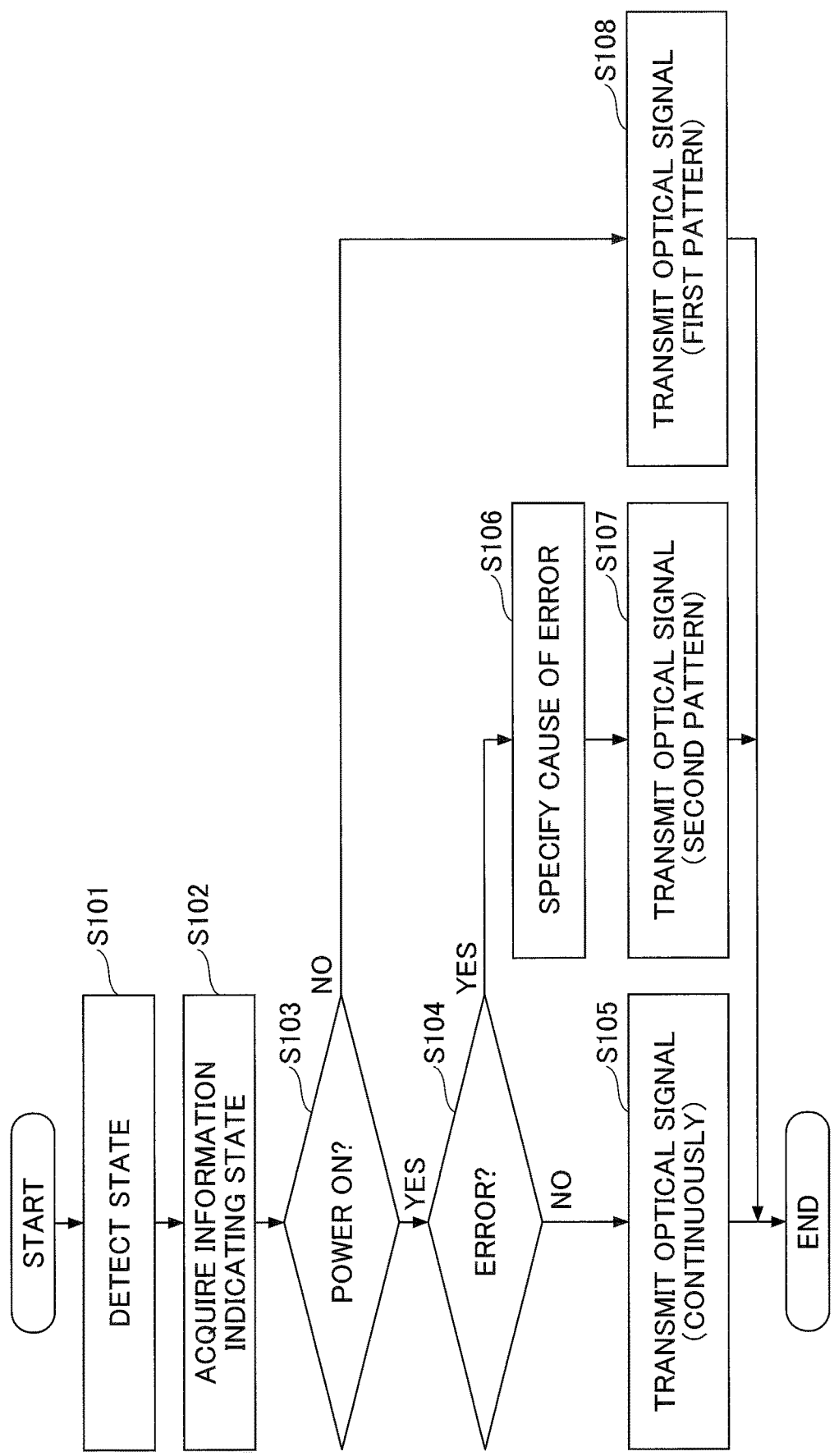
FIG. 8 is a flowchart illustrating an example of an operation of the device having a single light emitting unit.

Next, an operation of the device 2 will be described. FIG. 8 is a flowchart illustrating an example of an operation of a device 2 equipped with a single light emitting unit 23. The device 2 (e.g., device 2b) equipped with a single light emitting unit 23 performs the operation of FIG. 8 periodically or continuously. Hereinafter, a case in which the light emitting unit 23 emits visible light will be described.

First, at step S101, the state detecting unit 22 detects a state of the device main unit 21. Next, at step S102, the light emission control unit 24 acquires information indicating the state of the device main unit 21 from the state detecting unit 22.

When the light emission control unit 24 acquires the information indicating the state of the device main unit 21, the light emission control unit 24 checks whether the device main unit 21 is turned on (step S103). If the power of the device main unit 21 is ON (step S103: YES), the light emission control unit 24 checks whether or not an error occurs in the device main unit 21 (step S104).

If no error occurs in the device main unit 21 (step S104: NO), that is, when the device main unit 21 is normal, the light emission control unit 24 causes the light emitting unit 23 continuously to transmit an optical signal including information indicating at least one of a power state (ON), an operating state (normal), a voltage value, a current value, and an operating frequency of the device main unit 21 (step S105).

Meanwhile, if an error occurs in the device main unit 21 (step S104: YES), the light emission control unit 24 specifies a cause of the error occurring in the device main unit 21, based on the information acquired from the state detecting unit 22 and the error cause table (step S106).

Subsequently, at step S107, the light emission control unit 24 causes the light emitting unit 23 to transmit, in the second pattern, an optical signal including information indicating at least one of a power state (ON), an operating state (error), a cause of the error, a voltage value, a current value, and an operating frequency of the device main unit 21.

In contrast, if the power of the device main unit 21 is OFF (step S103: NO), the light emission control unit 24 causes the light emitting unit 23 to transmit, in the first pattern, an optical signal including information indicating at least one of a power state (OFF), an operating state, a voltage value, a current value, and an operating frequency of the device main unit 21 (step S108). When the power of the device main unit 21 is OFF, the device main unit 21 is stopped. Therefore, the optical signal need not include an operating state, a voltage value, a current value, and an operating frequency of the device main unit 21.

As a result of the above-described operation, the device 2 can transmit an optical signal that includes information indicating a state of the device main unit 21, by using the single light emitting unit 23. In addition, the device 2 can display the state of the device main unit 21 in a simple manner, by using a method of transmitting an optical signal (continuous transmission, transmission in the first pattern, and transmission in the second pattern).

Note that information contained in the optical signal and a method of transmitting the optical signal are not limited to the example illustrated in FIG. 8. Also, the light emitting unit 23 may emit invisible light, such as infrared light. In a case in which the light emitting unit 23 emits invisible light, simplified display of the state of the device main unit 21 cannot be performed. Therefore, the light emitting unit 23 may transmit an optical signal continuously.

Figure 9:
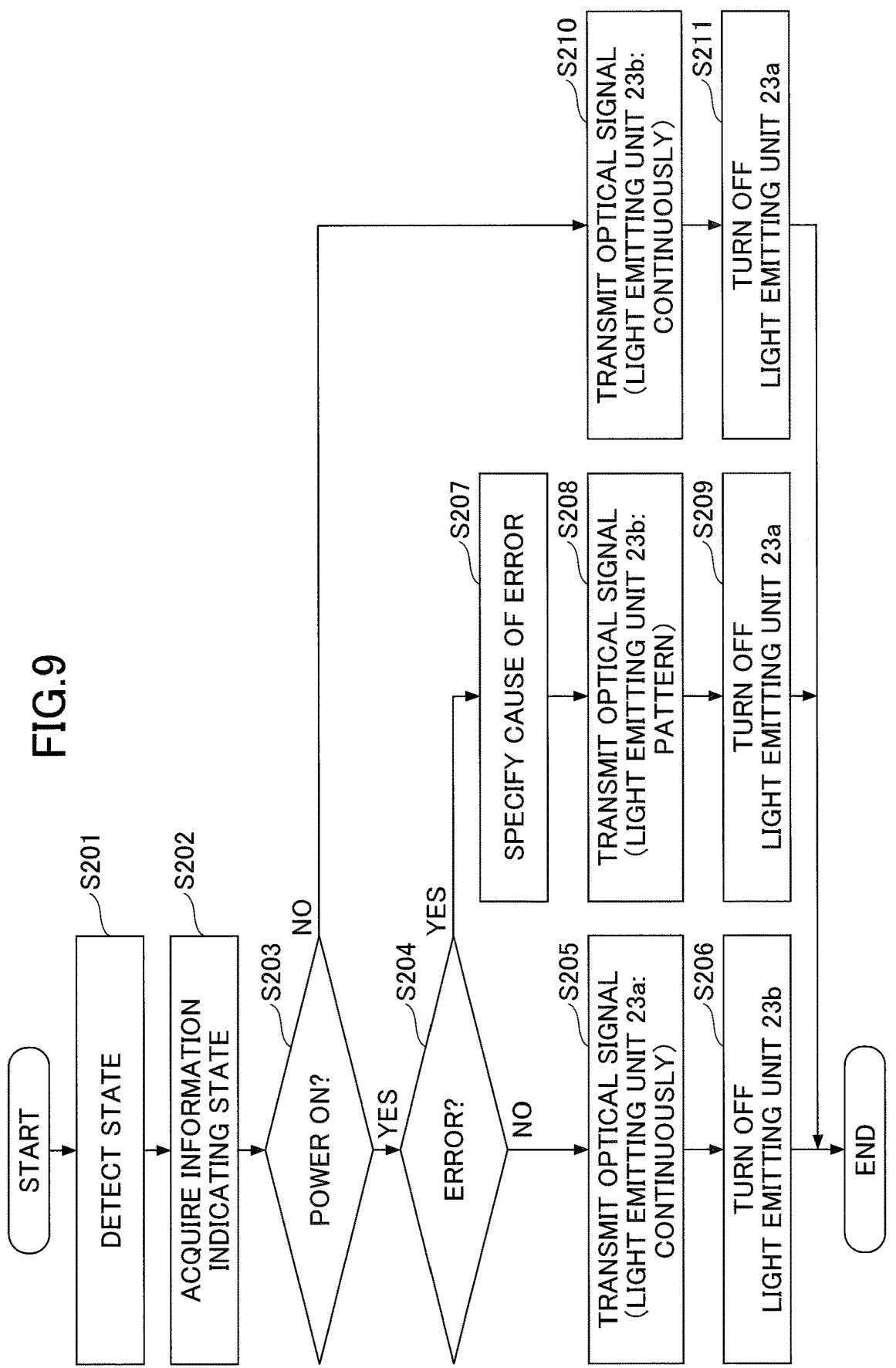
FIG. 9 is a flowchart illustrating an example of an operation of the device having two light emitting units.

FIG. 9 is a flowchart illustrating an example of an operation of the device 2 equipped with two light emitting units. The device 2 (such as the device 2a) equipped with two light emitting units (such as the light emitting units 23a and 23b) performs the operation of FIG. 9 periodically or continuously. Hereinafter, a case in which the light emitting units 23a and 23b emit visible light will be described.

First, at step S201, the state detecting unit 22 detects a state of the device main unit 21. Next, at step S202, the light emission control unit 24 acquires information indicating the state of the device main unit 21 from the state detecting unit 22.

When the light emission control unit 24 acquires the information indicating the state of the device main unit 21, the light emission control unit 24 checks whether the device main unit 21 is turned on (step S203). If the power of the device main unit 21 is ON (step S203: YES), the light emission control unit 24 checks whether or not an error occurs in the device main unit 21 (step S204).

If no error occurs in the device main unit 21 (step S204: NO), that is, when the device main unit 21 is normal, the light emission control unit 24 causes the light emitting unit 23a to continuously transmit an optical signal including information indicating at least one of a power state (ON), an operating state (normal), a voltage value, a current value, and an operating frequency (step S205), and the light emission control unit 24 turns off the light emitting unit 23b (step S206).

Meanwhile, if an error occurs in the device main unit 21 (step S204: YES), the light emission control unit 24 specifies a cause of the error occurring in the device main unit 21, based on the information acquired from the state detecting unit 22 and the error cause table (step S207).

Subsequently, the light emission control unit 24 causes the light emitting unit 23b to transmit, in a predetermined pattern, an optical signal including information indicating at least one of a power state (ON), an operating state (error), a cause of the error, a voltage value, a current value, and an operating frequency of the device main unit 21 (step S208), and the light emission control unit 24 turns off the light emitting unit 23a (step S209).

In contrast, if the power of the device main unit 21 is OFF (step S203: NO), the light emission control unit 24 causes the light emitting unit 23b to continuously transmits an optical signal including information indicating at least one of a power state (OFF), an operating state, a voltage value, a current value, and an operating frequency of the device main unit 21 (step S210), and the light emission control unit 24 turns off the light emitting unit 23a (step S211). When the power of the device main unit 21 is OFF, the device main unit 21 is stopped. Therefore, the optical signal need not include an operating state, a voltage value, a current value, and an operating frequency of the device main unit 21.

As a result of the above-described operation, the device 2 can transmit an optical signal that includes information indicating a state of the device main unit 21, by using the two light emitting units 23a and 23b. In addition, the device 2 can display the state of the device main unit 21 in a simple manner, by using the light emitting units 23a and 23b that transmit optical signals and using a method of transmitting optical signals (continuous transmission, transmission in accordance with a predetermined pattern).

Note that information contained in the optical signal and a method of transmitting the optical signal are not limited to the example illustrated in FIG. 9. Also, the light emitting units 23a and 23b may emit invisible light, such as infrared light. In a case in which the light emitting units 23a and 23b emit invisible light, the light emitting units 23a and 23b may continuously transmit optical signals because the simplified display of the device main unit 21 is impossible. Alternatively, one of the light emitting units 23a and 23b may emit visible light and the other one may emit invisible light. In this case, one of the light emitting units 23a and 23b continuously transmits an optical signal, while the other one can perform a simplified display of the state of the device main unit 21.

Figure 10:
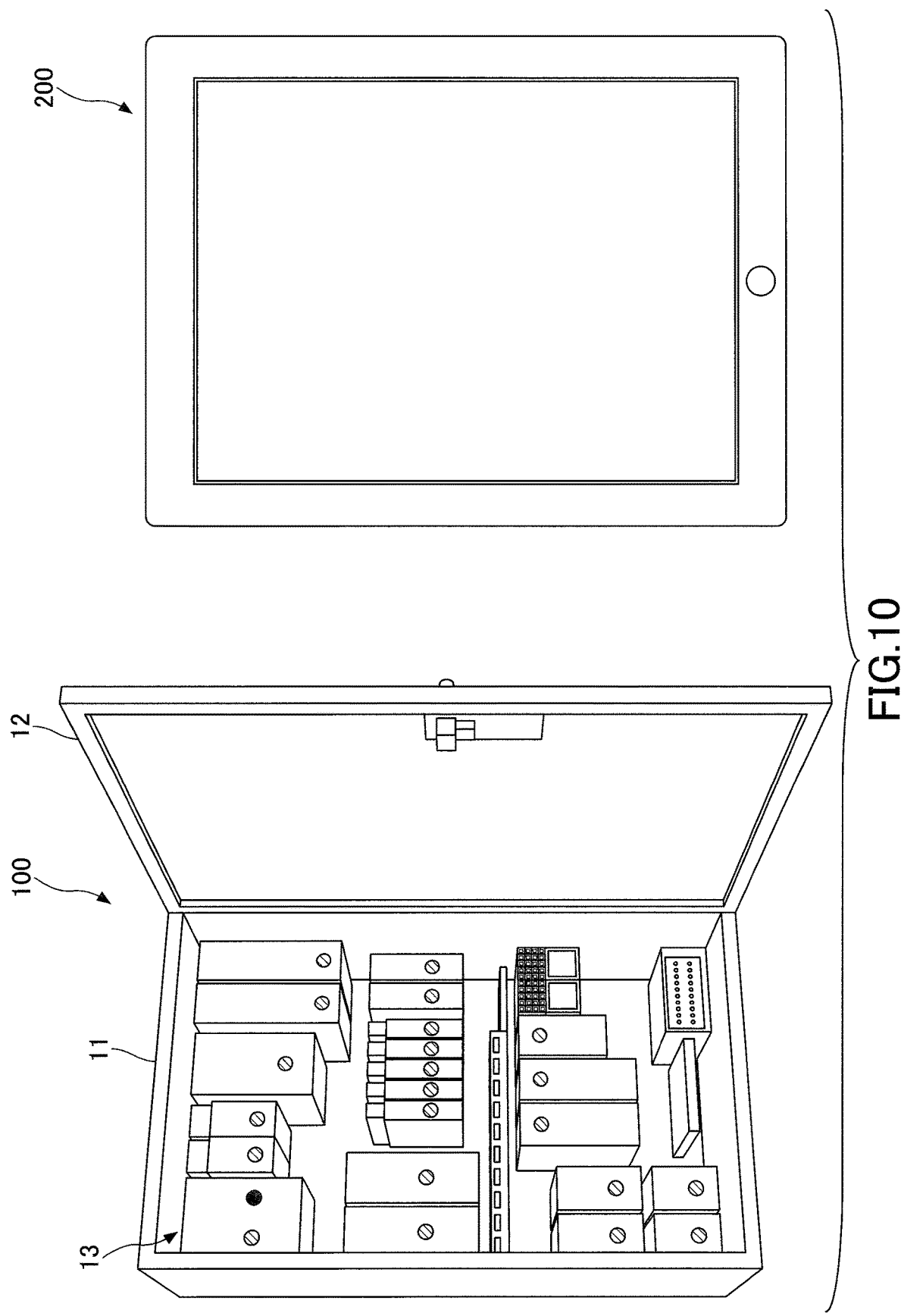
FIG. 10 is a schematic diagram illustrating a method for repairing the panelboard device.

Next, a method for repairing the panelboard device 100 by a maintenance technician will be described. FIG. 10 is a schematic view explaining a repair method of the panelboard device 100.

When an error occurs in the panelboard device 100, the error is detected by the centralized monitoring system, and a maintenance technician is dispatched to a site where the panelboard device 100 is installed. The maintenance technician is directed to the site with a terminal 200 for repair of the panelboard device 100. The terminal 200 is a computer equipped with a camera capable of receiving an optical signal transmitted from the light emitting unit 23, and the terminal 200 also includes a CPU, a ROM, a RAM, a storage device such as a hard disk drive (HDD) and a solid state drive (SSD), an input device such as a touch panel, and a display device. In the terminal 200, an application program (hereinafter referred to as a "reader application") for reading information from an optical signal received by the camera is pre-installed. Examples of the terminal 200 include, but are not limited to, a smartphone and a tablet terminal.

When the maintenance technician arrives at the site (where the panelboard device 100 is installed), the maintenance technician opens the door 12 of the panelboard device 100, starts up a reader application on the terminal 200, and captures the interior of the panelboard device 100 with the camera of the terminal 200. When the interior of the panelboard device 100 is captured, an image of the interior of the panelboard device 100 is displayed on the display device of the terminal 200. Also, when the inside of the panelboard device 100 is captured, the camera receives optical signals emitted by the multiple light emitting units 23 provided with the panelboard device 100. When the camera receives an optical signal, the reader application first performs a process for synchronizing the camera with the optical signal, by detecting a synchronization bit pattern added to the head of the optical signal. Specifically, the reader application sets a capturing frequency of the camera such that the capturing frequency becomes equal to a frequency of the optical signal, and causes the camera to perform capturing operations continuously at the set capturing frequency, in order to detect the synchronization bit pattern. If the synchronization bit pattern cannot be detected, the reader application determines that synchronization is not made, and causes the camera to perform capturing operations again by changing capturing timing. As a result of repeating the above-described operations, if the synchronization bit pattern can be detected, the reader application determines that synchronization is made. After the synchronization is made, the reader application reads the information included in each of the optical signals, and displays, on the display device, the read information (i.e., the information representing the state of the device main unit 21 of each device 2). The maintenance technician ascertains a status of each of the devices 2 (device main units 21) by referring to the information displayed on the display device, to repair the panelboard device 100.

FIG. 11 is a diagram illustrating an example of information indicating a state of the device main unit 21 displayed on the display device of the terminal 200. In the example of FIG. 11, for each of the devices 2, a device ID (identification information), a type, and information indicating the state of the device main unit (power state, operating state, voltage, current, and cause of error) are displayed in a table format. The table illustrated in FIG. 11 may be displayed on the same screen as a screen displaying an image of the interior of the panelboard device 100 captured by the camera, or the table may be displayed on a screen different from the screen displaying the image of the interior of the panelboard device 100 captured by the camera. Also, the table of FIG. 11 is updated each time the camera receives an optical signal.

By displaying information indicating a state of the device main unit 21 for each device 2 in a table format as in the example of FIG. 11, the maintenance technician can easily grasp the state of each of the devices 2 (device main units 21). In the example of FIG. 11, a record (row) displaying information about a device 2 (device ID=D04) in which an error has occurred is displayed in a different color from records displaying information about other devices 2. By conspicuously displaying a record displaying information about the device 2 in which an error has occurred, the maintenance technician can easily grasp the device 2 in which the error has occurred.

Figure 12:
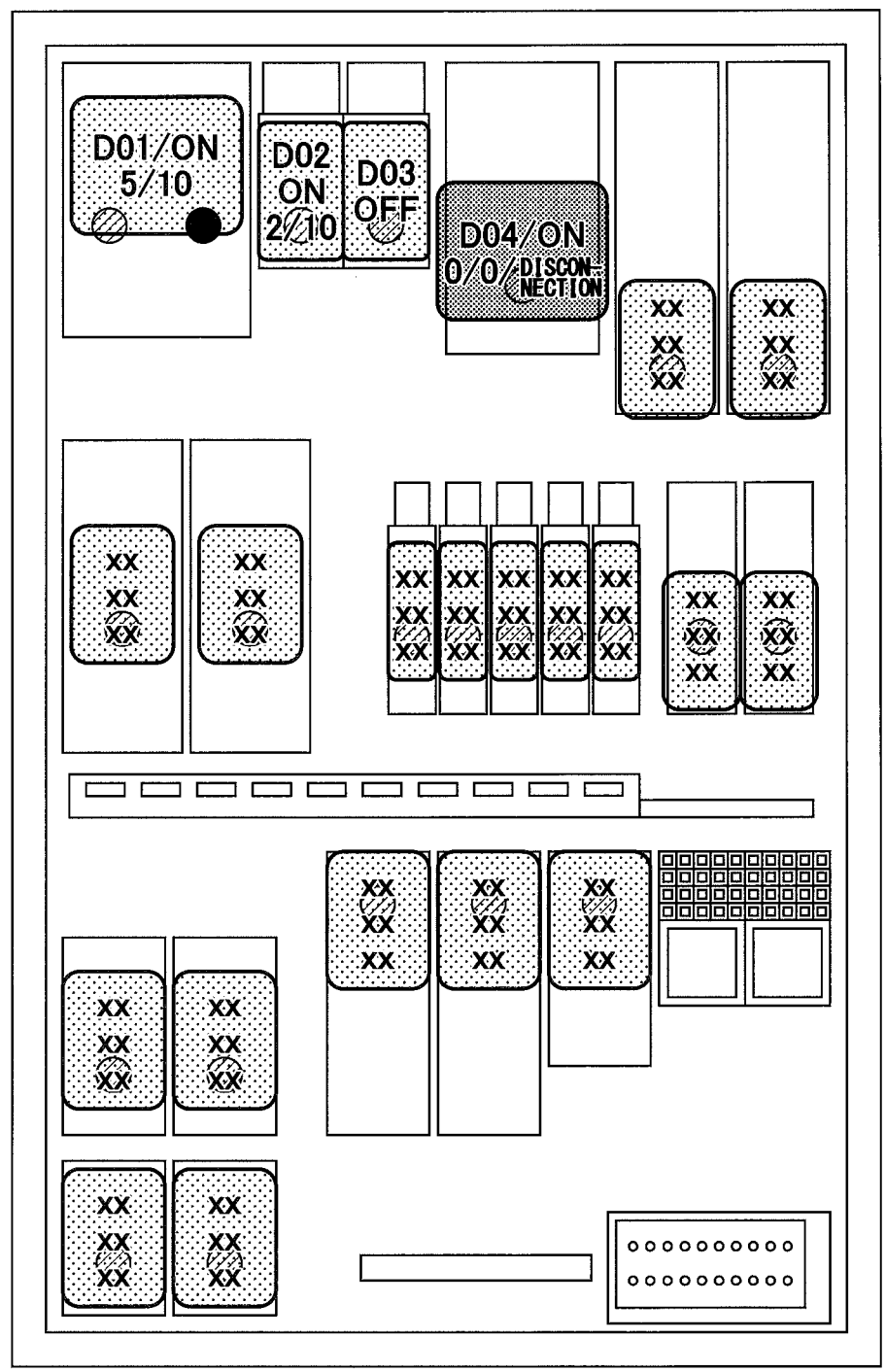
FIG. 12 is a diagram illustrating another example of information indicating a state of the device main unit displayed on the display device of the terminal.

FIG. 12 is a diagram illustrating another example of information indicating a state of the device main unit 21 displayed on the display device of the terminal 200. In the example of FIG. 12, information about each device 2 is displayed, using AR (Augmented Reality) functionality, in a display area corresponding to each device 2 in an image inside a panelboard device 100 captured by the camera. AR visualization as in FIG. 12 is realized by the reader application, in which a location of the light emitting unit 23 in an image of the interior of the panelboard device 100 captured by the camera is specified, a display area based on the specified location is defined, and information included in an optical signal received from the light emitting unit 23 is displayed in the defined display area.

In the example of FIG. 12, the display area corresponding to the device 2 is set on an image of the device 2. As described above, by defining the display area corresponding to the device 2 so as to overlap with at least a part of the image of the device 2, information about the device 2 is displayed on the image of the device 2. Therefore, a maintenance technician can easily grasp a status of each of the devices 2 (the device main units 21) more easily than in the example of FIG. 11.

Further, in the example of FIG. 12, a width of the display area corresponding to the device 2 is set to correspond to a width of the device 2. As described above, by setting the display area corresponding to the device 2 in accordance with a shape of the device 2, display areas for the devices 2 each can be naturally disposed on the image of the corresponding device 2. The shape of the device 2 can be extracted from the image of the interior of the panelboard device 100 captured by the camera, by using any image processing method.

In the example of FIG. 12, each display area is displayed so as not to overlap with each other. Accordingly, it is possible to prevent information about the device 2 from becoming invisible due to overlapping of display areas.

In the example of FIG. 12, a display area corresponding to the device 2 (device ID=D04) in which an error has occurred is displayed in a different color from the display areas corresponding to other devices 2.

As described above, by conspicuously displaying the display area for displaying information on the device 2 in which the error has occurred, a maintenance technician can easily identify the device 2 in which the error has occurred.

In the example illustrated in FIG. 12, amount of information displayed in each display area is different depending on a size of the display area. Specifically, more information is displayed as a display area is larger, and less information is displayed in a smaller display area. As described above, by adjusting amount of information displayed in a display area according to a size of the display area, the information can be naturally displayed in the display area.

As described above, according to the present embodiment, information indicating a state of the device main unit 21 of the device 2 is transmitted to the terminal 200 owned by a maintenance technician, with an optical signal emitted by the light emitting unit 23 of the device 2, and the information is displayed on the terminal 200. Because the state of the device main unit 21 can be easily ascertained by only referring to the terminal 200, the maintenance technician can repair the panelboard device 100 in a short time.

According to the present embodiment, information indicating a state of the device main unit 21 of the device 2 is directly transmitted to the terminal 200 owned by a maintenance technician, with an optical signal emitted by the light emitting unit 23 of the device 2. That is, without installing a communication device in the panelboard device 100 or providing an external server for collecting information from the panelboard device 100, the information indicating the state of the device main unit 21 can be transmitted to the terminal 200 possessed by the maintenance technician. Accordingly, maintenance cost of the panelboard device 100 can be reduced.

In addition, an optical signal generally has a shorter transmittable and receivable distance than a radio signal, and leakage of an optical signal to the outside is blocked by the door 12 when the door 12 is closed. Therefore, according to the present embodiment, as compared to a case in which information indicating a state of the device main unit 21 is transmitted through a radio signal, a risk that the information indicating the state of the device main unit 21 is eavesdropped can be reduced, and security of the panelboard device 100 can be improved.

It should be noted that the present invention is not limited to the above-described configurations, such as the configurations described in the above-described embodiments, including combinations with other elements. Modifications of configurations can be made without departing from the gist of the present invention, and can be appropriately determined according to the application form.

What is claimed is:

1. A panelboard device comprising:
a housing;
a plurality of devices stored in the housing; wherein
at least one device among the plurality of devices includes
a device main unit;
a state detecting unit configured to detect a state of the device main unit;
a light emitting unit configured to emit visible light; and
a light emission control unit configured
to acquire information indicating the state of the device main unit from the state detecting unit, and
to cause the light emitting unit to transmit an optical signal including ON periods and OFF periods that convey information indicating the state, the light emitting unit being turned-on during the ON periods and turned-off during the OFF periods, the ON periods and the OFF periods being alternated at a frequency at which the ON periods and the OFF periods alternating for a given duration appear to be continuously on to a person for the given duration, the ON periods and the OFF periods being adjusted to vary in timing and duration in response to the state detected by the state detecting unit; wherein
in a case in which the at least one device is in a first state, the light emission control unit causes the light emitting unit to transmit, without a break, the optical signal including the ON periods and the OFF periods, such that the ON periods and the OFF periods alternate with each other while appearing to be continuously on to the person without a break; and
in a case in which the at least one device is in a second state, the light emission control unit causes the light emitting unit to periodically transmit the optical signal including the ON periods and the OFF periods, such that the ON periods and the OFF periods alternate with each other while appearing to be continuously on to the person during a first duration, and such that the light emitting unit is turned off during a second duration, the first duration and the second duration alternating with each other, and
wherein the optical signal blinks to convey information to human eyes, and includes the ON periods and the OFF periods to convey information to an external device, the ON periods and the OFF periods including a first bit pattern and a second bit pattern, the first bit pattern being constant and unvarying, the second bit pattern varying in response to the state detected by the state detecting unit.

2. The panelboard device according to claim 1, wherein the optical signal includes information of the device main unit indicating a power state, an operating state, a cause of an error, a voltage value, a current value, an operating frequency, or any combination thereof.

3. The panelboard device according to claim 1, wherein
the housing includes an opening and a door configured to open and close the opening, and
the light emitting unit is provided on the device such that the light emitting unit is exposed from the opening in a state in which the door is opened.

4. The panelboard device according to claim 1, wherein the light emission control unit is configured to cause the light emitting unit to transmit the optical signal including the ON periods and the OFF periods, the ON periods and the OFF periods being alternated at a frequency in accordance with a type of the device.

5. The panelboard device according to claim 1, wherein the device includes a plurality of light emitting units.

6. The panelboard device according to claim 5, wherein at least two of the plurality of light emitting units are configured to emit light of different wavelength from each other.

7. The panelboard device according to claim 1, wherein the device includes a first light emitting unit configured to emit light of a first color, and a second light emitting unit configured to emit light of a second color; and
the light emission control unit is configured to cause either the first light emitting unit or the second light emitting unit to emit light, in accordance with the state of the device main unit.

8. The panelboard device according to claim 7, wherein the first color emitted by the first light emitting unit is different from the second color emitted by the second light emitting unit.

9. The panelboard device according to claim 1, wherein the light emission control unit is configured, in response to occurrence of an error in the device main unit, to cause the light emitting unit to transmit the optical signal including the ON periods and the OFF periods that convey information indicating a cause of the error.

10. The panelboard device according to claim 1, wherein the external device can operate in synchronization with the optical signal based on the first bit pattern.

* * * * *